United States Patent [19]

Steffen

[11] Patent Number: 4,555,624
[45] Date of Patent: Nov. 26, 1985

[54] HIGH RATE SEED SENSOR

[75] Inventor: David E. Steffen, Chatham, Ill.

[73] Assignee: DICKEY-john Corporation, Auburn, Ill.

[21] Appl. No.: 468,858

[22] Filed: Feb. 22, 1983

[51] Int. Cl.[4] ...................... H03K 21/04; G01D 21/00
[52] U.S. Cl. .................................. 250/223 R; 221/2; 250/206; 250/222.2
[58] Field of Search ............. 250/223 R, 222.2, 222.1, 250/214 R, 214 A, 206; 340/684; 221/2; 377/53

[56] References Cited

U.S. PATENT DOCUMENTS

| | | | |
|---|---|---|---|
| 3,537,091 | 10/1970 | Schenkenberg | 250/223 R |
| 3,618,819 | 11/1971 | Blackburn | 221/2 |
| 3,928,751 | 12/1975 | Fathauer | 377/53 X |
| 4,038,982 | 8/1977 | Burke et al. | |
| 4,157,468 | 6/1979 | Primiano | 250/223 R |
| 4,163,507 | 8/1979 | Bell | 221/2 |
| 4,307,390 | 12/1981 | Steffen et al. | 250/222.2 X |

Primary Examiner—Edward P. Westin
Attorney, Agent, or Firm—Trexler, Bushnell & Wolters, Ltd.

[57] ABSTRACT

A circuit is provided for a seed sensor which includes a light source and a light responsive element respectively positioned along a path of travel of seeds for producing a momentary change in signal level from the light responsive element in response to a momentary change of level of light incident thereupon from the light source due to the passage of one or more seeds therebetween. In accordance with the invention, the circuit comprises a pulse-producing circuit responsive to the change in signal level from the light responsive element for producing a discrete pulse signal in response to each change in the direction of the change in signal level. Predetermined ones of the discrete pulse signals are selected for counting.

15 Claims, 3 Drawing Figures

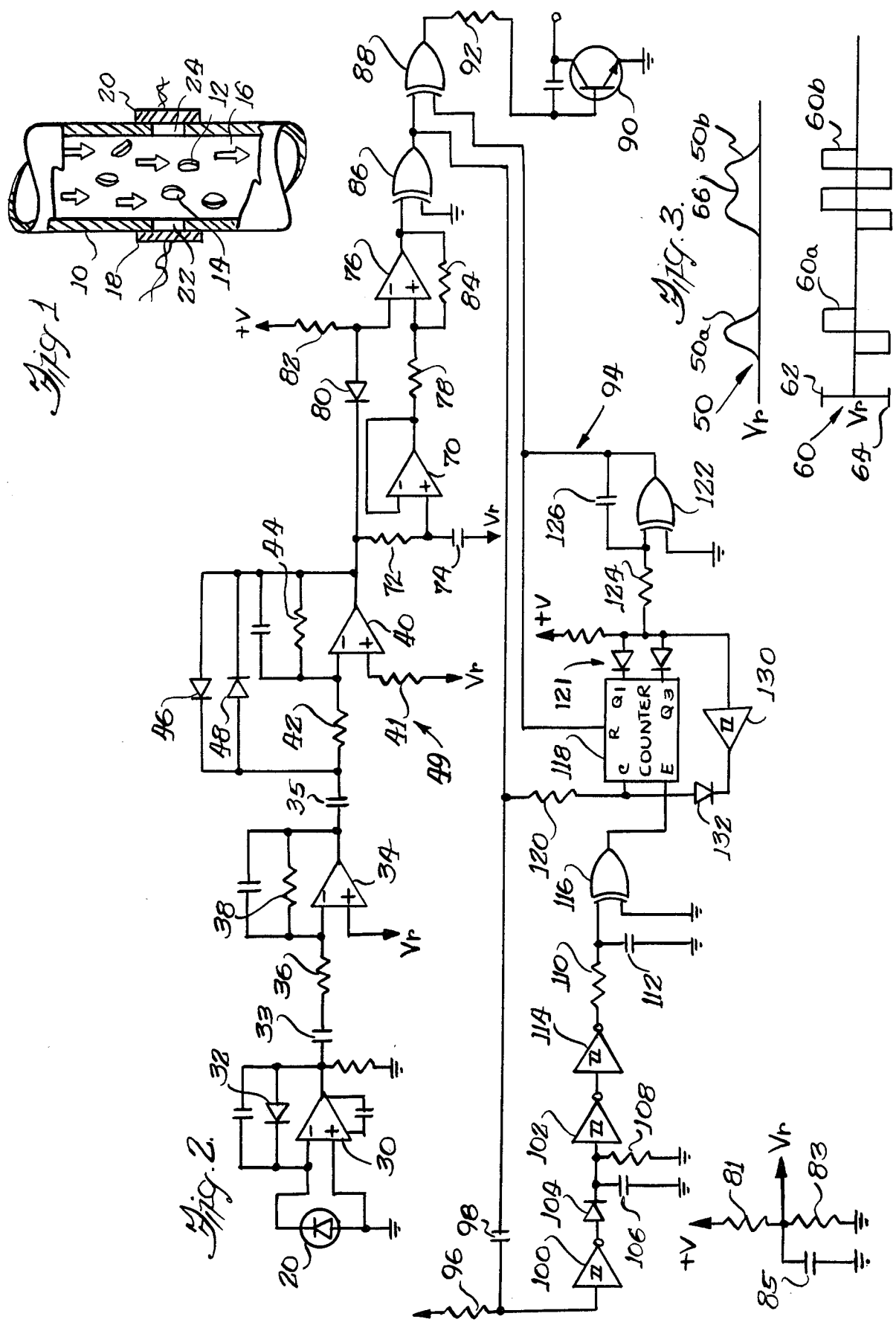

HIGH RATE SEED SENSOR

BACKGROUND OF THE INVENTION

This invention is directed generally to the monitoring and counting arts and more particularly to the counting of small objects such as the seeds being planted by a field seed planter.

As is known in the art, a field seed planter includes a group of seed chutes or seed discharge tubes, one for each row to be simultaneously planted. Each of these seed chutes or tubes automatically dispenses individual seeds from a hopper or other seed supply to individual furrows formed in the ground by the planter as it moves across a field. Various monitoring and counting arrangements have heretofore been utilized for obtaining a count of the number of seeds dispensed by such seed planters. Such counting is particularly useful in determining and controlling the density or population of seeds planted in order to optimize crop yield.

The prior art has generally utilized photoelectric devices to sense the passage of individual seeds through the seed chutes or tubes. Such arrangements generally have included a light source such as a light emitting diode (LED) positioned to one side of the seed chute or tube and a light responsive element such as a photoresponsive transistor positioned at the opposite side of the tube. Hence, the photoresponsive element normally produces a steady state signal level in response to the light incident thereupon from the light source. However, as a seed passes through the chute and intermediate the light source and light responsive element, the level of light incident upon the light responsive element momentarily decreases. Responsively, the light responsive element produces a momentary change in the normal or steady state signal level output thereof.

Various electrical and electronic circuits have been devised to receive the light responsive element output signal and respond to the changes in the level thereof due to the passage of a seed through the seed chute. Ideally, such electronic circuits should produce a discrete signal or pulse for each seed passing through the chute. Accordingly, accurate information as to the number of seeds dispensed by a given chute may be obtained by counting these pulses.

However, various problems have arisen in achieving the foregoing ideal situation. For example, the environment in which a field seed planter operates is far from optimum for the above-described photo responsive system. In this regard, considerable dirt, dust and the like is encountered as the planter moves through the field. Moreover, various coatings are commonly provided on seed grains, and these coatings often accumulate in the seed chutes or tubes. Accordingly, the foregoing accumulations of material in the seed tube tend to interfere with proper operation of the photoresponsive system. Additionally, the characteristics of the photoresponsive element and light source change somewhat over time, thus changing both the ambient light level incident upon the photoresponsive element and its response thereto and to changes in light level due to the passage of seeds. These changes may, if uncompensated for, greatly reduce the reliability of the response of the photoresponsive element.

A related problem is that of drift or changes over time in the nominal characteristics of the circuit elements utilized in the electronic circuits. For example, various circuit parameters such as gain, voltage levels, or the like may vary or drift somewhat over time. Such drift may occur for example due to environmental changes, detracting from optimum operation of the circuits and hence from the reliability of the count obtained therefrom.

Yet another problem has arisen in reliably counting multiple seeds which fall through the seed chute in close proximity or even partially overlapping. In such instances, both the photoresponsive element and the associated electronic circuit may be unable to respond rapidly enough to reliably produce a separate counting pulse for each seed.

A related problem is often encountered with relatively small, fast moving seeds such as soybeans. Additionally, soybeans are generally dispensed at a relatively high rate or density. Accordingly, the photo responsive element and associated electronic circuit may be incapable of sufficiently rapid response to reliably count each seed.

OBJECTS AND SUMMARY OF THE INVENTION

Accordingly, it is a general object of the invention to provide a novel and improved circuit for a seed sensor which substantially avoids the problems of the prior art.

A more specific object is to provide a circuit in accordance with the foregoing object which is responsive substantially only to changes in signal level from a light responsive element due to the passage of seeds and substantially insensitive to changes in signal level due to changes in ambient light level or other conditions.

A further object is to provide a circuit in accordance with the foregoing objects which is capable of discriminating between closely spaced or partially overlapping seeds and reliably producing a discrete pulse or count in response to each seed.

A related object is to provide such a circuit which has rapid response for accurate response to small, fast moving and/or densely spaced seeds.

Briefly, and in accordance with the foregoing objects, an improved circuit is provided for a seed sensor which includes a light source and light responsive means respectively positioned along a path of travel of seeds for producing a momentary change in signal level from the light responsive means in response to a momentary change of level of light incident thereupon from said light source due to the passage of one or more seeds therebetween. In accordance with the invention, the circuit comprises pulse-producing circuit means responsive to said change in signal level from said light responsive means for producing a discrete pulse signal in response to each change in the direction of said change in signal level. Predetermined ones of the discrete pulse signals are selected for counting.

BRIEF DESCRIPTION OF THE DRAWINGS

Other objects, features and advantages of the invention will become more readily apparent upon reading the following detailed description of the illustrated embodiment, together with reference to the drawings, wherein:

FIG. 1 is a diagramatic illustration of an exemplary seed chute or tube provided with a photoresponsive sensor arrangement, with which the present invention may advantageously be utilized;

FIG. 2 is a circuit schematic diagram of a novel circuit in accordance with the invention; and FIG. 3 is a graphical illustration of signals produced at various points of the circuit of FIG. 2, in response to the passage of seeds.

DETAILED DESCRIPTION OF THE ILLUSTRATED EMBODIMENT

Referring now to the drawings and initially to FIG. 1 a typical field seed planter (not shown) includes a number of seed chutes or tubes such as the tube 10. These seed chutes or tubes 10 provide a path of travel for seeds, such as seeds 12, 14 in the direction indicated by arrow 16, as the seeds are dispensed to be planted. The tube 10 may be cylindrical or otherwise shaped, and forms no part of the invention.

Further in accordance with conventional practice, a suitable seed sensing apparatus is positioned at an appropriate portion along the axial length of the tube 10 for sensing seeds such as the seeds 12, 14 as they move along the path of travel 16 through the tube 10. This sensing apparatus comprises a light source 18 positioned to one side of the tube 10 and a light responsive element 20 positioned oppositely the light source 18. Preferably, the tube 10 is provided with suitable transparent portions or windows 22, 24 through which light is transmitted from the light source 18 and viewed by the light responsive element 20. Preferably, as will be more fully described later, the light source 18 comprises one or more light emitting diodes (LED's)

In accordance with a preferred form of the invention, the light responsive element 20 comprises a photovoltaic cell, as will be more fully described later herein.

The light source 18 and light responsive element 20 are preferably positioned directly opposite each other transversely the axis or path of travel 16 of seeds through the tube 10. Accordingly, passage of each seed 12, 14 through the tube 10 and between the light source 18 and light responsive element 20 causes a momentary change of the level of light incident upon the light responsive element 20. As is well known, a light responsive element 20 such as a photovoltaic cell produces an ambient or steady state signal level responsive to the light incident thereupon from the light source 18. However, upon momentary interruption or change in this level of light incident thereupon, the photovoltaic cell 20 produces a corresponding momentary change in its signal level.

Reference is now invited to FIG. 2 wherein a novel circuit in accordance with the invention is illustrated. The circuit of FIG. 2 is particularly advantageous in providing an accurate count of the number of seeds passing through the tube 10 in response to the above-described output signal characteristics of the light responsive element or photovoltaic cell 20. In this regard, the photovoltaic cell 20 is illustrated in circuit schematic form coupled across the inverting and non-inverting inputs of a first operational amplifier (op amp) 30. It will be noted that the photovoltaic cell 20 as well as the non-inverting input of the operational amplifier 30 coupled to one side thereof is referenced to circuit ground.

Advantageously, the op amp 30 is provided with a gain control feedback comprising a diode 32 having an anode coupled to the output of the op amp 30 and a cathode coupled to the inverting input of the op amp 30. Accordingly, the op amp 30 and diode 32 function as an automatic gain control, whereby the output of op amp changes level momentarily in a substantially constant proportion to the momentary changes in signal level from the photovoltaic cell 20 due to the passage of seeds as described above. Only the DC level of this output is affected by more gradual changes in the output of the photovoltaic cell. Such gradual changes may occur due to circuit changes over time or with temperature or humidity changes, or other factors causing changes in the level of light produced by the light source 18. Such gradual changes may also occur due to the buildup of dirt, dust or other materials partially obscuring or blocking the respective windows 22, 24 described above. It will also be noted that the feedback diode 32 results in operation of the photovoltaic cell 20 in a substantially linear region near the zero signal level.

The output of the op amp 30 is AC coupled to the inverting input of a second op amp 34, having a non-inverting input referenced to a predetermined reference voltage Vr. The second op amp 34 thus operates to reference the gain controlled signal from the photovoltaic cell 20 against this predetermined reference level Vr. This reference level Vr is derived from a suitable positive voltage supply +V by a voltage divider comprising resistors 81, 83 and is provided with a smoothing capacitor 85. In the illustrated embodiment the op amp 34 is provided with a suitable current limiting input resistor 36 and a feedback resistor 38 to result in a gain of substantially two.

The output of the op amp 34 is series coupled through a capacitor 35 and a resistor 42 to the inverting input of a high gain op amp 40. The non-inverting input of op amp 40 is referenced against the same voltage reference level Vr by way of a suitable current limiting resistor 41. This op amp 40 is also provided with a feedback resistor 44 selected with resistor 42 for a gain of on the order of 40. Accordingly, it will be recognized that the op amp 40 is responsive to even relatively small changes in the signal level received from the op amp 34 with respect to the reference voltage.

In accordance with a feature of the invention, the junction of capacitor 35 with resistor 42 is coupled with respective cathode and anode electrodes of a pair of offset and feedback diodes 46 and 48. The remaining anode and cathode electrodes of these diodes are respectively coupled to the output of the op amp 40. Accordingly, the output of the op amp 40 is clamped to within one diode drop in either direction of the signal at the junction of capacitor 35 with resistor 42. It will be recalled that this signal is at the reference voltage level Vr in the absence of momentary changes in signal level from the photovoltaic cell 20 produced in response to the passage of seeds.

Referring now also to FIG. 3, typical waveforms produced by the photovoltaic cell, operational amplifiers 30 and 34 and operational amplifier 40 are illustrated, as an aid to understanding the operation of the circuit components thus far described.

The first waveform 50 represents both the output of the photovoltaic cell 20 and the outputs of op amps 30 and 34. While the op amps 30 and 34 invert their inputs and add the gain control and voltage referencing features discussed above, their output waveforms substantially follow the waveform produced by the photovoltaic cell 20 in response to passage of seeds.

As indicated above, an important feature of the invention is the ability to discriminate between closely spaced or partially overlapping speeds passing through the seed chute 10. In this regard, the circuit thus far described is capable of producing discrete signals, suitable for counting, even in response to such closely spaced or partially overlapping seeds.

Accordingly, and referring still to FIG. 3, a first waveform 50a illustrates a typical response of the photovoltaic cell and following circuits including op amps 30 and 34 to passage of a single seed. However, the waveform 50b represents a typical response of the foregoing elements to a pair of closely spaced or partially overlapping seeds, such as the seeds 12, 14 shown in FIG. 1.

The second waveform or graph 60 represents the response of the novel circuit comprising the op amp 40 and related components, which will hereinafter be referred to as a differentiating or discriminating circuit and designated generally by reference numeral 49. The first graph portion 60a represents response of this discriminating circuit to the waveform 50a thereabove while the second portion 60b represents response to the waveform 50b.

It will be noted that the reference level Vr has been indicated as a reference or baseline in both graphs or waveforms 50 and 60. Accordingly, the waveform 50 may be taken as preferably the waveform of the output of op amp 34, which it will be remembered acts to reference this waveform or change in level against the reference voltage Vr.

In operation, then, the foregoing differentiating or discriminating circuit acts as a switching circuit responsive to the reference level Vr and to the change in signal level from the photovoltaic cell 20 for producing a discrete pulse signal in response to each change in the direction of the signal or waveform 50 with respect to the reference level Vr. Referring to the waveform 60a, it will be seen that the high gain op amp 40 drives its output in a strongly negative direction with respect to the reference level Vr in response to the initial change in the waveform 50a in a positive direction from the reference level Vr. As the waveform 50a reaches a peak level, indicating the passage of the seed through a position where it causes the maximum blockage of light or change in light level, the waveform 60a rapidly returns to the reference level Vr. Hence, the discriminating circuit is responsive primarily to the change in the waveform 50a with respect to the reference level Vr. Hence, when the waveform 50a reaches its peak and is no longer changing with respect to the voltage reference, the circuit 49 rapidly returns its output to the reference level Vr. As the seed passes further along the tube 10 the wave form 50a will decrease with respect to Vr, changing in a relatively negative direction. Responsively, the circuit 49 produces a second portion of the waveform 60a which abruptly changes in the full positive direction from the reference level Vr. It will be remembered that the full positive and negative extents of the waveform 60 are offset substantially one diode drop away from the voltage reference level Vr in response to the offsetting action of the offset and feedback diodes 46 and 48. These diodes drops are indicated graphically in the graph 60 at reference numerals 62 and 64.

In accordance with a feature of the invention and referring now to waveform graphs 50b and 60b, response of the circuit 49 to partially overlapping seeds is illustrated. It will be noted that the waveform 50b proceeds to some peak value as the first of two seeds 12, 14 reaches a point wherein the maximum amount of light is blocked or maximum light level variation or change is reached. Thereafter, the waveform 50b decreases in level relative to the voltage reference Vr. Responsively, the first portion of the waveform 60b is substantially identical with the first portion of the waveform 60a. That is, the output of op amp 40 rapidly responds to the initial upward movement or change in waveform 50b relative to reference Vr by going a full diode drop below the reference Vr. In the same fashion as described with respect to waveforms 50a and 60a, the waveform 60b rapidly returns to the voltage reference Vr in response to the peak or zero change level of waveform 50b and again rapidly rises to one diode drop above Vr in response to the decreasing portion of waveform 50b as the first of two seeds 12, 14 passes by.

However, it will be noted that the waveform 50b does not return to the voltage reference level due to the presence of the second, closely spaced or partially overlapping seed 14. Rather, the waveform 50b experiences a brief zero change portion or dip as indicated at reference numeral 66. Responsively, the waveform 60a returns rapidly to the voltage reference Vr. Thereupon, due to presence of the second seed 14, the waveform 50b again increases, peaks and decreases with respect to the reference level Vr. Responsively, the circuit 49 produces a second substantially identical portion of waveform 60b going first one diode drop below and then one diode drop above the reference level Vr in response to the second portion of the waveform 50b due to passage of the second seed 14.

From the foregoing it will be seen that the passage of each seed causes two discrete, pulse-like signals to be produced by the circuit 49. Accordingly, discrete pulse signals suitable for counting are produced in response to each seed passing through the tube 10.

Advantageously, the high gain and clamping action of diodes 46 and 48 assure that such separate or discrete pulse-like signals are produced even in response to the passage of two or more partially overlapping seeds. Although two such discrete pulse signals, one positive-going and one negative-going with respect to the reference Vr are produced in response to each seed, preferably only the positive-going pulses are selected for counting, thus resulting in a one-to-one correspondence between the number of seeds and number of pulses counted.

Referring again to FIG. 2, the remaining circuit elements further process the output of the circuit 49 for counting. A further operational amplifier 70 acts as a buffer and receives the output of op amp 40 by way of an integrator circuit comprising series-coupled resistor 72 and capacitor 74. This integrator circuit is also coupled to the reference level Vr. The output of the buffer provides feedback to the inverting input of op amp 70 and also feeds the non-inverting input of a further operational amplifier 76 by way of a series-coupled resistor 78. The output of op amp 40 feeds the cathode of a diode 80 whose anode is coupled to the inverting input of the op amp 76 and also to a positive voltage supply by way of a suitable current limiting resistor 82. A suitable positive feedback resistor 84 provides some hysteresis in the operation of op amp 76.

In the foregoing circuit, the diode 80 and the hysteresis of the op amp 76 together assure that the output of op amp 40 must switch the diode 80 across a predetermined threshold level to produce a responsive output from the op amp 76. That is, the output of the op amp 40 must move sufficiently away from the reference level Vr to pull the inverting input of op amp 76 through the voltage drop provided by diode 80 and built in hysteresis. This prevents response to any spurious or noise signals which may otherwise momentarily cause small excursions of the output of the op amp 40 from the reference level Vr. Additionally, the provision of the buffer op amp 70 and integrated circuit comprising resistor 72 and capacitor 74 compensates for any voltage offsets throughout the circuit from the reference level Vr, and any variations in the nominal or desired gains throughout the circuit, leakage currents, and the like. Hence, such circuit variations are substantially compensated for or averaged out.

The output of the op amp 76 feeds one input of a two input exclusive-OR gate 86, whose output feeds one input of a further two input exclusive-OR gate 88. The remaining input of the exclusive-OR gate 86 is coupled to circuit ground. The op amp 76 and gate 86 also function as a second pulse-producing circuit for producing a single pulse signal output in response to only one of each pair of pulses 60a or 60b produced by the first pulse-producing or differentiating circuit 49. The output of this second exclsuve-OR gate 88 feeds a switching transistor 90 by way of a suitable current limiting resistor 92. This switching transistor 90 may be utilized to produce a suitable output pulse to a counter or other suitable monitoring devices (not shown).

The remaining input of exclusive-OR gate 88 receives the output of a pulse adding or multiplying circuit designated generally by the reference numeral 94. An input to this circuit comprises the output of the gate 86. Briefly, the circuit 94 operates to add a predetermined number of pulses to the pulses arriving at the output of the exclusive-OR gate 88 when the rate at which pulses are produced at the output of exclusive-OR gate 86 is at or above a predetermined rate.

In the monitoring and counting of seeds such as soybeans which are planted relatively high densities or rates, it has been found that large numbers or "bunches" of seeds occasionally pass the sensing components in the seed tube (see FIG. 1). Accordingly, the statistical probability that some of these seeds will remain uncounted may be compensated for by adding a statistically determined number of pulses to the output signal of the circuit of FIG. 2. This is accomplished by the circuit 94.

Briefly, a fast differentiator comprising a resistor 96 and capacitor 98 receives the output of gate 86 and feeds a one-shot circuit comprising inverter buffers 100, 102, diode 104, capacitor 106 and resistor 108. This one-shot feeds an integrator circuit comprising a resistor 110 and capacitor 112 by way of a further inverter buffer 114. The integrator feeds one input of a two input exclusive-OR gate 116 whose remaining input is grounded. The exclusive-OR gate 116 feeds the enable input (E) of a counter integrated circuit component 118. The foregoing circuits serve to enable the counter 118 only when the rate of pulses and hence rate of seeds being detected is at or above a level which indicates the planting rate of soybeans.

The count input (C) of the counter 118 receives the output of the exclusive-OR gate 86 by way of a series-coupled resistor 120. In the illustrated embodiment, the counter 118 is of the type generally designated 4520. Selected outputs (Q1, Q3) of the counter 118 are fed by diodes 121 to one input of a two-input exclusive-OR gate 122 whose remaining input is grounded. A time delay through the exclusive-OR gate 122 is provided by resistor 124 and capacitor 126. The time delayed output of the exclusive-OR gate 122 is fed back to the remaining input of previously mentioned exclusive-OR gate 88 to comprise additional pulses as described above. This delayed output of exclusive-OR gate 122 also feeds the reset input of the counter 118.

The diodes at the output of counter 118 are also provided with a suitable voltage pull-up and feeds an inverter buffer 130 which functions to pull the count input (C) of the counter 118 to ground by way of a diode 132 to avoid running the counter in response to additional pulses prior to the reset from the time delayed exclusive-OR gate 122. Preferably, this time delay is further selected so that additional pulses produced by counter 118 are inserted into the pulse stream to switching transistor 90 intermediate pulses produced at the output of exclusive-OR gate 86.

While the invention has been illustrated and described hereinabove with reference to a preferred embodiment, the invention is not limited thereto. Those skilled in the art may devise various changes, alternatives and modifications upon reading the foregoing descriptions. Such alternatives, changes and modifications form a part of the present invention insofar as they fall within the spirit and scope of the appended claims.

The invention is claimed as follows:

1. An improved circuit for a seed sensor which includes a light source and light responsive means respectively positioned along a path of travel of seeds for producing a momentary change in signal level from the light responsive means in response to a momentary change of level of light incident thereupon from said light source due to the passage of one or more seeds therebetween, said circuit comprising: a switching circuit responsive to said change in signal level from said light responsive means for producing an output signal including a discrete pulse signal in response to the initiation of said change in signal level and thereafter a further discrete pulse signal in response to each change in the direction of said change in signal level.

2. A circuit in accordance with claim 1 wherein said circuit further comprises automatic gain control circuit means coupled intermediate said light responsive means and said switching circuit means for producing a signal which substantially follows said momentary change in signal level of said light responsive means due to the passage of a seed, substantially without regard for changes of the ambient light level incident thereupon from said light source.

3. A circuit according to claim 1 and further including means for producing a reference level and wherein said switching circuit means comprises differentiating circuit means responsive to each said initiation and each said directional change of said change in signal level for producing respective corresponding discrete pulse signals which sequentially reverse in sense with respect to said reference level and offset and feedback circuit means coupled with said differentiating circuit means for causing the differentiating circuit means to clamp said output signal substantially to said reference level in response to a substantially zero rate of change of said change in signal level.

4. A circuit according to claim 3 and further including reference circuit means interposed intermediate said light responsive means and said switching circuit means for referencing said change in signal level from said light responsive means against said reference level.

5. A circuit according to claim 3 wherein said offset and feedback circuit means further causes said differentiating circuit means to clamp said output signal to levels offset by a predetermined amount to either side of said reference level in response to said initiation and to said changes in direction of said change in signal level, to define said discrete pulse signals.

6. A circuit according to claim 2 wherein said differentiating circuit means comprises high gain amplifier circuit means for response to relatively small valves of said initiation and said changes in direction of said change in signal level.

7. A circuit according to claim 3 wherein said offset and feedback circuit means comprises a pair of diodes coupled in mutually opposite polarities across said differentiating circuit means.

8. A circuit for a seed sensor which includes a light source and light responsive means respectively positioned with respect to a path of travel of seeds for producing a changing signal level from said light responsive means in response to a changing level of light incident thereupon from said light source due to the passage of one or more seeds along said path of travel therebetween, said circuit comprising: means providing a predetermined reference level; and switching circuit means coupled to receive said predetermined reference level and to receive said changing signal level from said light responsive means, said switching circuit means being responsive to said reference level and said changing signal level for producing an output signal which reverses in sense about said reference level in response to each change in the direction of the changing signal level of said light responsive means 9. A circuit according to claim 8 wherein said switching circuit means comprises high gain amplifier means for response to relatively small values of said changing signal level.

10. A circuit according to claim 8 and further including automatic gain control circuit means coupled intermediate said light responsive means and said switching circuit means for producing a changing signal level which substantially follows only the changing signal level from said light responsive means due to the passage of a seed, without regard for any change in the ambient light level incident upon said light responsive means.

11. A circuit according to claim 10 and further including referencing means coupled intermediate said automatic gain control circuit means and said switching circuit means for referencing said changing signal level against said predetermined reference level.

12. A circuit according to claim 8 wherein said switching circuit means includes differential amplifier circuit means having inputs respectively coupled to receive said reference level and said changing signal level and having an output for producing said output signal and offset and feedback circuit means coupled intermediate the output of said differential amplifier means and the input thereof which receives said changing signal level for clamping said output signal to levels offset by a predetermined amount to either wide of said reference level in response to said changes in direction of said changing signal level.

13. A circuit according to claim 12 wherein said offset and said fedback circuit means comprises a pair of diodes coupled in mutually opposite polarities across said differential amplifier circuit means.

14. An improved circuit for a seed sensor which includes a light source and light responsive means respectively positioned along a path of travel of seeds for producing a momentary change in signal level from the light responsive means in response to a momentary change of level of light incident thereupon from said light source due to the passage of one or more seeds therebetween, said circuit comprising; pulse-producing circuit means responsive to said change in signal level from said light responsive means for producing a first pulse signal in response to initiation of said change in signal level and a further pulse signal in response to each change in the direction of said change in signal level thereafter, whereby two pulse signals are produced in response to each seed; and second pulse-producing circuit means responsive to one of each said two pulse signals produced for producing a single counting pulse.

15. A circuit according to claim 14 and further including third pulse producing circuit means coupled to receive said counting pulses and responsive to the rate at which said counting pulses are produced for producing a predetermined number of additional counting pulses.

* * * * *